(12) United States Patent
Poon et al.

(10) Patent No.: US 8,237,911 B2
(45) Date of Patent: Aug. 7, 2012

(54) APPARATUS AND METHODS FOR KEEPING IMMERSION FLUID ADJACENT TO AN OPTICAL ASSEMBLY DURING WAFER EXCHANGE IN AN IMMERSION LITHOGRAPHY MACHINE

(75) Inventors: Alex Poon, San Ramon, CA (US);
Leonard Kho, San Francisco, CA (US);
Gaurav Keswani, Fremont, CA (US);
Derek Coon, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 223 days.

(21) Appl. No.: 11/976,898

(22) Filed: Oct. 29, 2007

(65) Prior Publication Data

US 2008/0225246 A1    Sep. 18, 2008

Related U.S. Application Data

(60) Provisional application No. 60/918,057, filed on Mar. 15, 2007.

(51) Int. Cl.
*G03B 27/32* (2006.01)
*G03B 27/42* (2006.01)
*G03B 27/52* (2006.01)

(52) U.S. Cl. .................. 355/30; 355/53; 355/77

(58) Field of Classification Search .................. 355/30, 355/53, 67, 72, 77
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 4,509,852 A | 4/1985 | Tabarelli et al. |
| 5,528,100 A | 6/1996 | Igeta et al. |
| 5,528,118 A | 6/1996 | Lee |
| 5,610,683 A | 3/1997 | Takahashi |
| 5,611,452 A | 3/1997 | Bonora et al. |
| 5,623,853 A | 4/1997 | Novak et al. |
| 5,668,672 A | 9/1997 | Oomura |
| 5,689,377 A | 11/1997 | Takahashi |

(Continued)

FOREIGN PATENT DOCUMENTS

DE          221 563 A1       4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

Apparatus and methods keep immersion liquid in a space adjacent to an optical assembly. An optical assembly projects an image onto a substrate supported adjacent to the optical assembly by a substrate table. An insertion member insertable into the space between the optical assembly and the substrate, the substrate table, or both, divides the immersion liquid into a first portion and a second portion, the first portion disposed between the optical assembly and the insertion member, and the second portion disposed between the insertion member and the substrate, the substrate table, or both. The insertion member keeps the optical assembly in contact with the first portion when the substrate is moved away from being disposed adjacent to the optical assembly.

34 Claims, 7 Drawing Sheets

U.S. PATENT DOCUMENTS

| | | |
|---|---|---|
| 5,715,039 A | 2/1998 | Fukuda et al. |
| 5,825,043 A | 10/1998 | Suwa |
| 5,835,275 A | 11/1998 | Takahashi et al. |
| 5,874,820 A | 2/1999 | Lee |
| 6,262,796 B1 | 7/2001 | Loopstra et al. |
| 6,341,007 B1 | 1/2002 | Nishi et al. |
| 6,445,441 B1 | 9/2002 | Mouri |
| 6,788,477 B2 | 9/2004 | Lin |
| 6,842,221 B1 | 1/2005 | Shiraishi |
| 7,075,616 B2 | 7/2006 | Derksen et al. |
| 7,098,991 B2 | 8/2006 | Nagasaka et al. |
| 7,110,081 B2 | 9/2006 | Hoogendam et al. |
| 7,119,876 B2 | 10/2006 | Van Der Toorn et al. |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0259234 A1 | 11/2005 | Hirukawa et al. |
| 2005/0270505 A1 | 12/2005 | Smith |
| 2006/0023182 A1 | 2/2006 | Novak et al. |
| 2006/0023184 A1 | 2/2006 | Coon et al. |
| 2006/0023186 A1 | 2/2006 | Binnard |
| 2006/0082741 A1 | 4/2006 | Van Der Toorn et al. |
| 2006/0103820 A1 * | 5/2006 | Donders et al. .............. 355/53 |
| 2006/0114445 A1 | 6/2006 | Ebihara |
| 2006/0126037 A1 * | 6/2006 | Jansen et al. ................. 355/30 |
| 2006/0132733 A1 | 6/2006 | Modderman |
| 2006/0152697 A1 | 7/2006 | Poon et al. |
| 2007/0046910 A1 | 3/2007 | Poon et al. |
| 2007/0216882 A1 | 9/2007 | Benschop et al. |
| 2008/0233512 A1 * | 9/2008 | Nishii et al. ............ 430/117.32 |
| 2009/0231560 A1 * | 9/2009 | Poon et al. ................... 355/30 |
| 2009/0268174 A1 * | 10/2009 | Shibazaki ................... 355/30 |

FOREIGN PATENT DOCUMENTS

| | | |
|---|---|---|
| DE | 224 448 A1 | 7/1985 |
| EP | 1420298 A2 * | 5/2004 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-06-124873 | 5/1994 |
| JP | A-07-220990 | 8/1995 |
| JP | A-7-220990 | 8/1995 |
| JP | A-08-136475 | 5/1996 |
| JP | A-08-171054 | 7/1996 |
| JP | A-8-316125 | 11/1996 |
| JP | A-08-330224 | 12/1996 |
| JP | A-08-334695 | 12/1996 |
| JP | A-10-003039 | 1/1998 |
| JP | A-10-020195 | 1/1998 |
| JP | A-10-303114 | 11/1998 |
| JP | A-10-340846 | 12/1998 |
| JP | A-11-176727 | 7/1999 |
| JP | A-2000-58436 | 2/2000 |
| WO | WO 99/49504 A1 | 9/1999 |
| WO | WO 02/091078 A1 | 11/2002 |
| WO | WO 03/077037 A1 | 9/2003 |
| WO | WO 2003/085708 A1 | 10/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |

| | | |
|---|---|---|
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, $3^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi OWA et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, Potential performance and feasibility of immersion lithography, Soichi OWA et al., 33 pages slides 1-33.

Aug. 13, 2008 International Search Report in International Application No. PCT/US2008/003224.

Aug. 13, 2008 Written Opinion in International Application No. PCT/US2008/003224.

* cited by examiner

APPARATUS AND METHODS FOR KEEPING IMMERSION FLUID ADJACENT TO AN OPTICAL ASSEMBLY DURING WAFER EXCHANGE IN AN IMMERSION LITHOGRAPHY MACHINE

This application claims the benefit of U.S. Provisional Application No. 60/918,057 filed Mar. 15, 2007. The disclosure of the provisional application is incorporated herein by reference in its entirety.

BACKGROUND

Lithography systems are commonly used to transfer images from a reticle onto a semiconductor wafer during semiconductor processing. A typical lithography system includes an optical assembly, a reticle stage for holding a reticle defining a pattern, a wafer stage assembly that positions a semiconductor wafer, and a measurement system that precisely monitors the position of the reticle and the wafer. During operation, an image defined by the reticle is projected by the optical assembly onto the wafer. The projected image is typically the size of one or more die on the wafer. After an exposure, the wafer stage assembly moves the wafer and then another exposure takes place. This process is repeated until all the die on the wafer are exposed. The wafer is then removed and a new wafer is exchanged in its place.

Immersion lithography systems utilize a layer of immersion fluid that completely fills a space between the optical assembly and the wafer during the exposure of the wafer. The optic properties of the immersion fluid, along with the optical assembly, allow the projection of smaller feature sizes than is currently possible using standard optical lithography. For example, immersion lithography is currently being considered for next generation semiconductor technologies including those beyond 45 nanometers. Immersion lithography therefore represents a significant technological breakthrough that enables the continued use of optical lithography.

After a wafer is exposed, it is removed and exchanged with a new wafer. As contemplated in some immersion systems, the immersion fluid would be removed from the space and then replenished after the wafer is exchanged. More specifically, when a wafer is to be exchanged, the fluid supply to the space is turned off, the fluid is removed from the space (i.e., by vacuum), the old wafer is removed, a new wafer is aligned and placed under the optical assembly, and then the space is re-filled with fresh immersion fluid. Once all of the above steps are complete, exposure of the new wafer can begin. In a tandem (or twin) stage immersion lithography system, a pair of wafer stages are provided, with the stages being alternately positioned under the optical assembly while wafer exchange and/or alignment is performed on the wafer stage not disposed under the optical assembly. When the exposure of the wafer under the optical assembly is complete, the two stages are swapped and the process is repeated. Examples of such exposure apparatus are disclosed in U.S. Pat. No. 6,341,007 and in U.S. Pat. No. 6,262,796, the disclosures of which are incorporated herein by reference in their entireties.

Wafer exchange with immersion lithography as described above continues to be problematic for a number of reasons. The repeated filling and draining of the space may cause bubbles to form within the immersion fluid. Bubbles may interfere with the projection of the image on the reticle onto the wafer, thereby reducing yields. The overall process also involves many steps and is time consuming, which reduces the overall throughput of the machine.

For examples of systems which reduce the overall throughput of the machine, see US 2006/0023186 A1 and US 2005/0036121 A1, the disclosures of which are incorporated herein by reference in their entireties.

SUMMARY

An apparatus and method for keeping immersion fluid in the space adjacent to the projection optical system when the wafer stage and/or the wafer table moves away from the projection optical system, for example during wafer exchange and/or during long fast moves, are therefore desirable. Furthermore, an apparatus and method in which one or more object is positioned opposite to the projection optical system to keep immersion fluid in a space between the projection optical system and the one or more objects, when moving the wafer stage and/or wafer table away from the projection optical system, are desirable. As a result, machine throughput can be increased.

According to one aspect, the apparatus includes an optical assembly that projects an image onto a substrate and a stage assembly including a substrate table that supports the substrate adjacent to the optical assembly. An environmental system is provided to supply an immersion fluid to and remove the immersion fluid from the space between the optical assembly and the substrate on the stage assembly. A movable insertion member removably insertable into the space between the optical assembly and the substrate, the substrate table, or both, is provided to divide the immersion fluid into a first portion and a second portion. The first portion is disposed between the optical assembly and the insertion member, and the second portion is disposed between the insertion member and the substrate, the substrate table, or both. The insertion member keeps the optical assembly in contact with the first portion of the immersion fluid when moving the substrate and/or the substrate table away from being disposed adjacent to the optical assembly. An exchange system removes the substrate from the substrate table and replaces it with a second substrate. Because of the insertion member, the space does not have to be fully refilled with immersion fluid when the second substrate is positioned adjacent to the optical assembly.

DETAILED DESCRIPTION OF EMBODIMENTS

Figure 1:
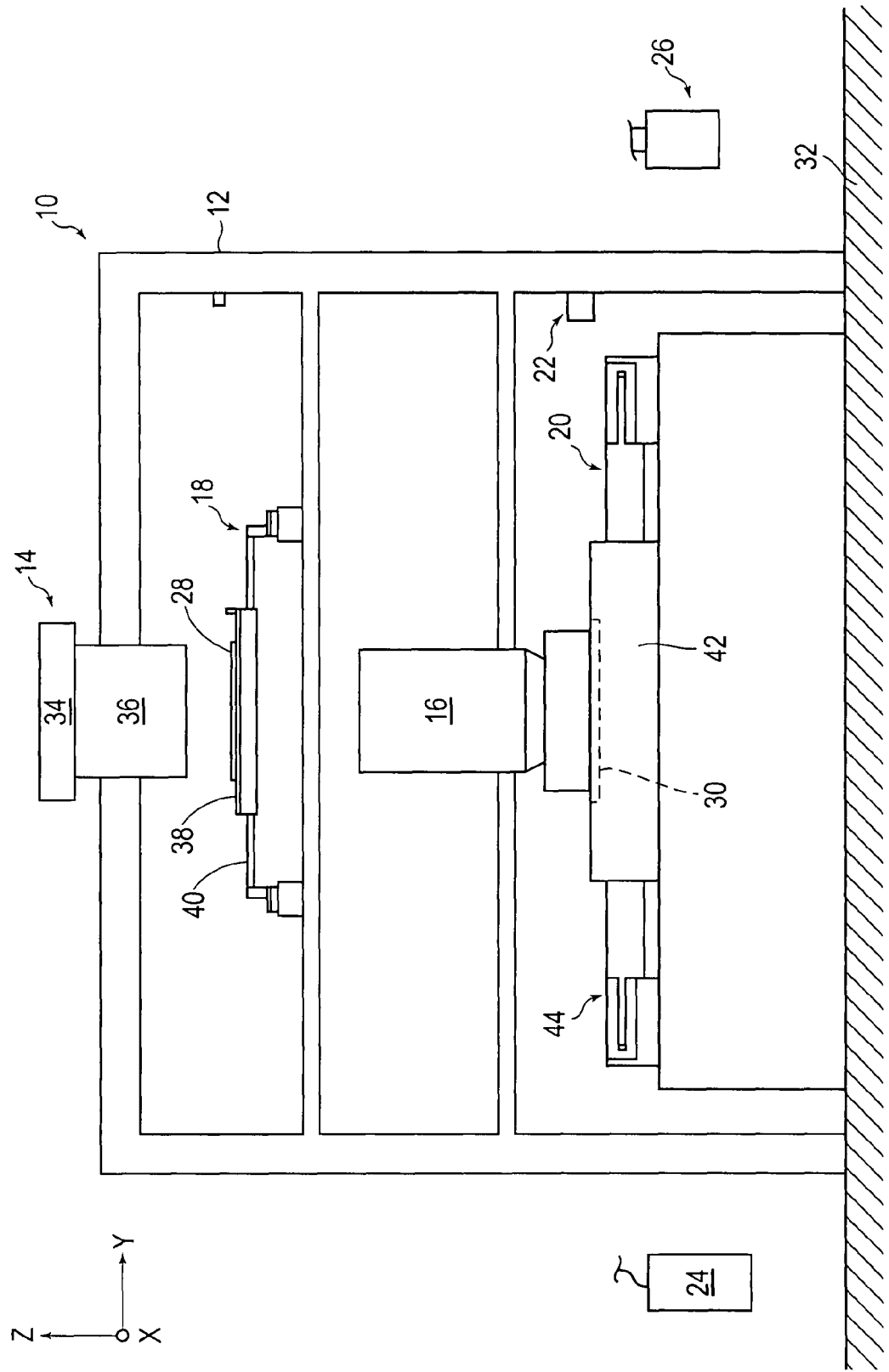
FIG. 1 is an illustration of an immersion lithography machine.

FIG. 1 is a schematic illustration of a lithography machine 10. The lithography machine 10 includes a frame 12, an illumination system 14 (irradiation apparatus), an optical assembly 16, a reticle stage assembly 18, a substrate stage assembly 20, a measurement system 22, a control system 24, and a fluid environmental system 26. The design of the components of the lithography machine 10 can be varied to suit the design requirements of the lithography machine 10.

In one embodiment, the lithography machine 10 is used to transfer a pattern (not shown) of an integrated circuit from a reticle 28 onto a semiconductor wafer 30 (illustrated in phantom). The lithography machine 10 mounts to a mounting base 32, e.g., the ground, a base, or floor or some other supporting structure.

In various embodiments, the lithography machine 10 can be used as a scanning type photolithography system that exposes the pattern from the reticle 28 onto the wafer 30 with the reticle 28 and the wafer 30 moving synchronously. In a scanning type lithographic machine, the reticle 28 is moved perpendicularly to an optical axis of the optical assembly 16 by the reticle stage assembly 18, and the wafer 30 is moved perpendicularly to the optical axis of the optical assembly 16 by the wafer stage assembly 20. Exposure occurs while the reticle 28 and the wafer 30 are moving synchronously.

Alternatively, the lithography machine 10 can be a step-and-repeat type photolithography system that performs exposure while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 20 perpendicularly to the optical axis of the optical assembly 16 so that the next field of the wafer 30 is brought into position relative to the optical assembly 16 and the reticle 28 for exposure. Following this process, the image on the reticle 28 is sequentially exposed onto the fields of the wafer 30.

However, the use of the lithography machine 10 provided herein is not necessarily limited to a photolithography for semiconductor manufacturing. The lithography machine 10, for example, can be used as an LCD photolithography system that exposes a liquid crystal display substrate pattern onto a rectangular glass plate or a photolithography system for manufacturing a thin film magnetic head. Accordingly, the term "substrate" is generically used herein to refer to any device that may be patterned using lithography, such as but not limited to wafers or LCD substrates.

The apparatus frame 12 supports the components of the lithography machine 10. The apparatus frame 12 illustrated in FIG. 1 supports the reticle stage assembly 18, the wafer stage assembly 20, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 28 and exposes the wafer 30. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be, for example, a g-line source (436 nm), an i-line source (365 nm), a KrF excimer laser (248 nm), an ArF excimer laser (193 nm) or a $F_2$ laser (157 nm). Alternatively, the illumination source 34 can generate an x-ray.

The optical assembly 16 projects and/or focuses the light passing through the reticle 28 to the wafer 30. Depending upon the design of the lithography machine 10, the optical assembly 16 can magnify or reduce the image illuminated on the reticle 28. The optical assembly 16 need not be limited to a reduction system. It also could be a 1× or greater magnification system.

Also, with an exposure substrate that employs vacuum ultraviolet radiation (VUV) of wavelength 200 nm or lower, use of a catadioptric type optical system can be considered. Examples of a catadioptric type of optical system are disclosed in U.S. Pat. No. 5,668,672, as well as U.S. Pat. No. 5,835,275. In these cases, the reflecting optical system can be a catadioptric optical system incorporating a beam splitter and concave mirror. U.S. Pat. No. 5,689,377 as well as European Patent Application Publication No. EP 816892 A2 also use a reflecting-refracting type of optical system incorporating a concave mirror, etc., but without a beam splitter, and also can be employed with this embodiment. The disclosures of the above-mentioned U.S. patents, as well as the European patent application publication are incorporated herein by reference in their entireties.

The reticle stage assembly 18 holds and positions the reticle 28 relative to the optical assembly 16 and the wafer 30. In one embodiment, the reticle stage assembly 18 includes a reticle stage 38 that retains the reticle 28 and a reticle stage mover assembly 40 that moves and positions the reticle stage 38 and reticle 28.

Each stage mover assembly 40, 44 (44 being for the substrate) can move the respective stage 38, 42 with three degrees of freedom, less than three degrees of freedom, or more than three degrees of freedom. For example, in alternative embodiments, each stage mover assembly 40, 44 can move the respective stage 38, 42 with one, two, three, four, five or six degrees of freedom. The reticle stage mover assembly 40 and the substrate stage mover assembly 44 can each include one or more movers, such as rotary motors, voice coil motors, linear motors utilizing a Lorentz force to generate drive force, electromagnetic movers, planar motors, or other force movers.

In photolithography systems, when linear motors (see U.S. Pat. Nos. 5,623,853 or 5,528,118 which are incorporated by reference herein in their entireties) are used in the wafer stage assembly or the reticle stage assembly, the linear motors can be either an air levitation type employing air bearings or a magnetic levitation type using Lorentz force or reactance force. Additionally, the stage could move along a guide, or it could be a guideless type stage that uses no guide.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100. Additionally, reaction forces generated by the reticle (mask) stage motion can be mechanically transferred to the floor (ground) by use of a frame member as described in U.S. Pat. No. 5,874,820. The disclosures of U.S. Pat. Nos. 5,528,100 and 5,874,820 are incorporated herein by reference in their entireties.

The measurement system 22 monitors movement of the reticle 28 and the wafer 30 relative to the optical assembly 16 or some other reference. With this information, the control system 24 can control the reticle stage assembly 18 to precisely position the reticle 28 and the substrate stage assembly 20 to precisely position the wafer 30. The design of the measurement system 22 can vary. For example, the measurement system 22 can utilize multiple laser interferometers, encoders, mirrors, and/or other measuring devices.

The control system 24 receives information from the measurement system 22 and controls the stage assemblies 18, 20 to precisely position the reticle 28 and the wafer 30. Additionally, the control system 24 can control the operation of the components of the environmental system 26. The control system 24 can include one or more processors and circuits.

The environmental system 26 controls the environment in a space (not shown) between the optical assembly 16 and the wafer 30. The space includes an imaging field. The imaging field includes the area adjacent to the region of the wafer 30 that is being exposed and the area in which the beam of light energy travels between the optical assembly 16 and the wafer 30. With this design, the environmental system 26 can control the environment in the imaging field. The desired environment created and/or controlled in the space by the environmental system 26 can vary accordingly to the wafer 30 and the design of the rest of the components of the lithography machine 10, including the illumination system 14. For example, the desired controlled environment can be a liquid such as water. Alternatively, the desired controlled environment can be another type of fluid such as a gas. In various embodiments, the space may range from 0.1 mm to 10 mm in height between top surface of the wafer 30 and the last optical element of the optical assembly 16.

In one embodiment, the environmental system 26 fills the imaging field and the rest of the space with an immersion fluid. The design of the environmental system 26 and the components of the environmental system 26 can be varied. In different embodiments, the environmental system 26 delivers and/or injects immersion fluid into the space using spray nozzles, electro-kinetic sponges, porous materials, etc. and removes the fluid from the space using vacuum pumps, sponges, and the like. The environmental system 26 confines the immersion fluid in the space below the optical assembly 16. The environmental system 26 forms part of the boundary of the space between the optical assembly 16 and one or more objects, for example the wafer 30, the wafer stage assembly 20, or both. The immersion fluid confined by the environmental system 26 covers a localized area on a surface of the wafer 30, the wafer stage assembly 20, or both. The design of the environmental system 26 can vary. For example, it can inject the immersion fluid at one or more locations at or near the space. Further, the immersion fluid system can assist in removing and/or scavenging the immersion fluid at one or more locations at or near the wafer 30, the space and/or the edge of the optical assembly 16. For additional details on various environmental systems, see, for example, U.S. 2007/0046910 A1, U.S. 2006/0152697 A1, U.S. 2006/0023182 A1 and U.S. 2006/0023184 A1, the disclosures of which are incorporated herein by reference in their entireties.

Figure 2A:
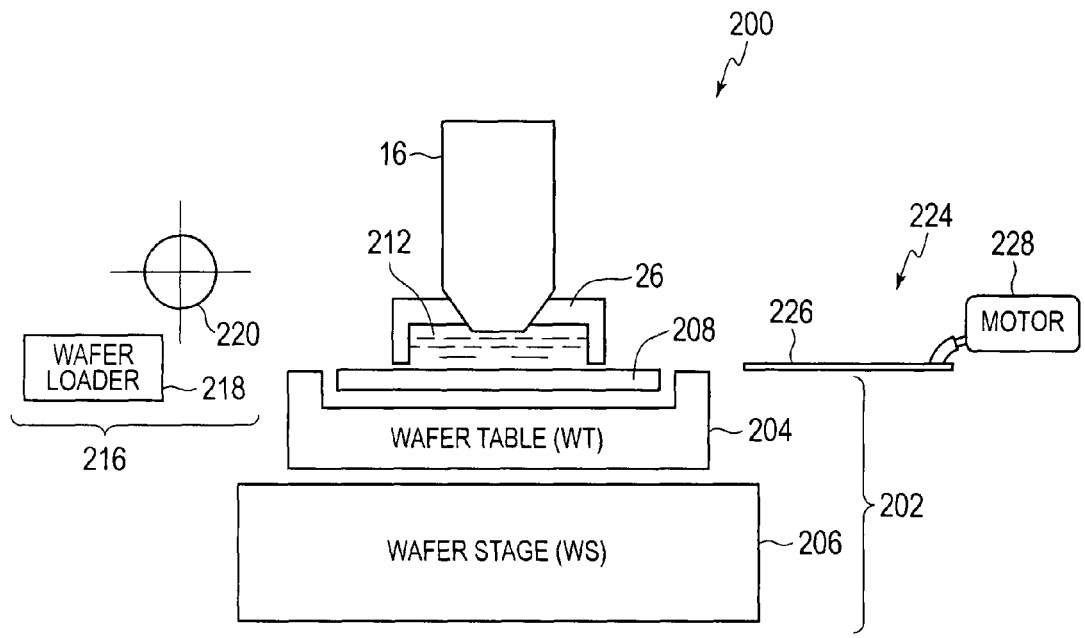
FIGS. 2A and 2B are a cross section and a plan view of an immersion lithography machine according to one embodiment.
Figure 2B:
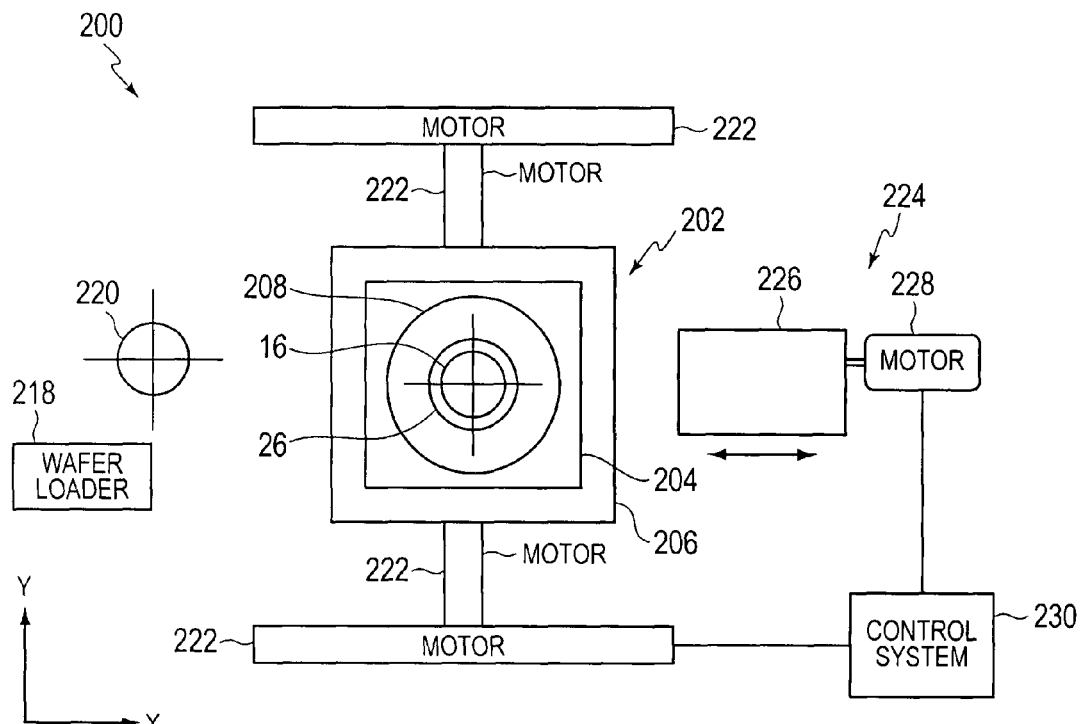

Referring to FIGS. 2A and 2B, a cross section and a plan (overhead) view of an immersion lithography machine illustrating one embodiment are shown. The lithography machine 200 includes an optical assembly 16 and a stage assembly 202 that includes a wafer table 204 and a wafer stage 206. The wafer table 204 is configured to support a wafer 208 (or any other type of substrate) under the optical assembly 16. An environmental system 26, surrounding the optical assembly 16, is used to supply and remove immersion fluid 212 from the space between the wafer 208 and the lower most optical element of the optical assembly 16. A substrate exchange system 216, including a wafer loader 218 (i.e., a robot) and an alignment tool 220 (for example, a microscope and CCD camera), is configured to remove the wafer 208 on the wafer table 204 and replace it with a second wafer. This is typically accomplished using the wafer loader 218 to remove the wafer 208 from the wafer table 204. Subsequently, the second wafer (not shown) is placed onto the wafer loader 218, aligned using the alignment tool 220, and then positioned under the optical assembly 16 on the wafer table 204. As best illustrated in FIG. 2B, a set of motors 222 are used to move the wafer assembly 202 including the wafer table 204 and wafer stage 206 in up to six degrees of freedom (X, Y, Z, $\theta_X$, $\theta_Y$, $\theta_Z$) during operation. As noted above, the motors 222 can be any type of motors, such as linear motors, rotary motors, voice coil motors, etc.

The immersion lithography machine 200 also includes an insertion member positioning system 224 that is configured to maintain some of the immersion fluid 212 in a space below the optical assembly 16 while the wafer table 204 is away from under the optical assembly 16 (e.g., during wafer exchange, alignment and long fast moves of the substrate away from the optical system). The insertion member positioning system 224 includes a movable insertion member 226, a motor 228, and a control system 230. The movable insertion member 226 is movable into the space between the wafer 208, the wafer table 204, or both, and the lower most optical element of the optical assembly 16, so as to be positioned adjacent to and between the optical assembly 16 and a wafer 208 on the wafer table 204. Specifically, the movable insertion member 226 is movable into the space between the wafer 208, the wafer table 204, or both, and the lower end portion of the environmental system 26, so as to keep the immersion fluid 212 in the space between the movable insertion member 226 and the optical assembly 16. In this position, as will be discussed below, the movable insertion member 226 causes a portion of the immersion liquid 212 to be trapped between the optical assembly 16 and the insertion member 226. The movable insertion member 226 also is removable from (i.e., out of) the space between the wafer 208 and the lower most optical element of the optical assembly 16. Thus, in the embodiment of FIGS. 2A and 2B, after the movable insertion member 226 is inserted into the space between the wafer 208 and the lower most optical element of the optical assembly 16, the movable insertion member 226 is not released from the motor 228 by the control system 230. That is, the movable insertion member 226 remains attached to the motor 228 (i.e., held by the control system 230) in the position adjacent to and between the optical assembly 16 and a wafer 208 on the wafer table 204. The movable insertion member 226 is held adjacent to the projection system 16 without contacting the projection system 16 after the movable insertion member 226 is moved into the space between the projection system 16 and the substrate wafer 208. The movable insertion member 226 is movable in up to six degrees of freedom directions using one or more motors 228, which are controlled by the control system 230. The motor 228 can be any type of motor. The movable insertion member 226 is positioned under (adjacent to) the optical assembly 16 before the wafer table 204 (the wafer stage 206) and the held wafer is moved away from being under the optical assembly 16.

Figure 3A:
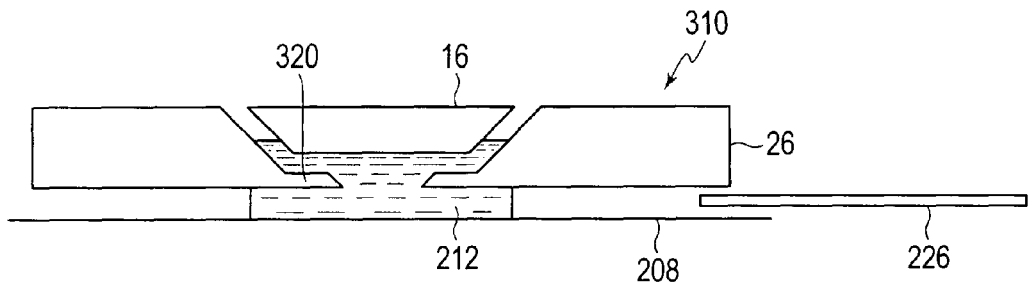
FIGS. 3A to 3D illustrate further details of the movable insertion member of the immersion lithography machine according the embodiment of FIGS. 2A and 2B.
Figure 3B:
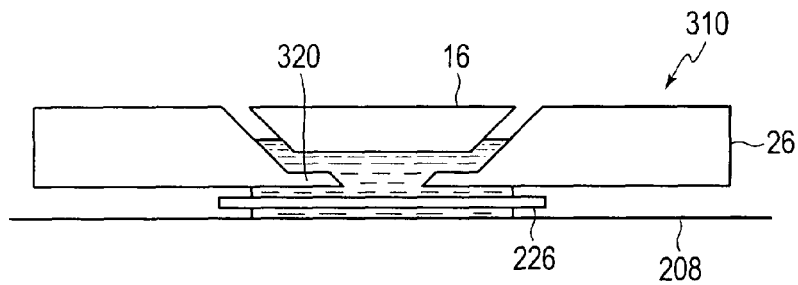
Figure 3C:
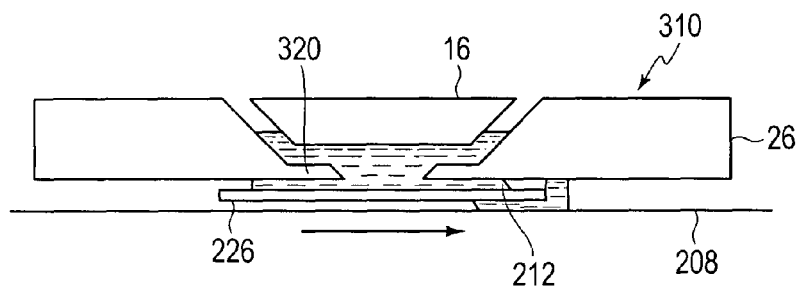
Figure 3D:
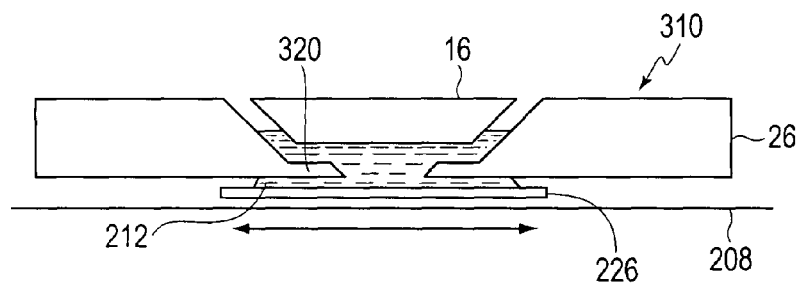

FIGS. 3A to 3D illustrate an example of how the movable insertion member 226 keeps the optical assembly 16 in contact with at least a portion of the immersion liquid 212. As shown in FIG. 3A, immersion liquid 212 is continuously supplied to the immersion fluid element (liquid confinement member) 310 of the environmental system 26 around the last optical element of the optical assembly 16, and is continuously recovered through the recovery element 320, which may be a porous media vacuum, etc., of the environmental system 26. The recovery element 320 (porous media) is provided at the lower surface of the immersion fluid element 310. In FIG. 3A, the wafer 208 is opposite to the optical assembly 16 and the immersion fluid element 310 (and the recovery element 320). Further, the wafer table 204 or both the wafer 208 and the wafer table 204 may be positioned under the optical assembly 16 and the immersion fluid element 310 (and the recovery element 320). At this time, the movable insertion member 226 is disposed outside of the space between the optical assembly 16 and the wafer 208. Before a wafer exchange, during which the wafer table 204 moves away from the optical assembly 16, the immersion liquid 212 should be removed from the wafer stage 206. Accordingly, the control system 230 directs the motor 228 to move the movable insertion member 226 into the space between the wafer 208 and the lower most optical element of the optical assembly 16. Specifically, the movable insertion member 226 is moved into the space between the wafer 208 and the lower end of the immersion fluid element 310. As shown in FIG. 3B, the movable insertion member 226 divides the immersion liquid 212 in the space into a first portion between the optical assembly 16 and the insertion member 226, and a second portion between the insertion member 226 and the wafer 208. Thus, the movable insertion member 226 keeps the optical assembly 16 in contact with the first portion of the immersion liquid 212 when the wafer 208 is moved away (via movement of the wafer stage 206) from being disposed adjacent to the optical assembly 16. In FIG. 3B, the first portion includes the space between the wafer 208 and the immersion fluid element 310. By moving the wafer 208, as shown in FIG. 3C, the immersion liquid 212 under the movable insertion member 226 can be removed through the porous media 320 of the immersion fluid element 310. When moving the wafer 208, the liquid 212 may be removed from a recovery outlet (not shown) provided on the wafer table 204 and/or a recovery outlet (not shown) provided on the back surface and/or the side surface of the moveable insertion member 226. After all the immersion liquid 212 is recovered from the wafer 208, shown in FIG. 3D, the wafer stage 206 can move long distances at maximum speed without having liquid escaping from the immersion fluid element 310. In addition, because no liquid is left on the wafer 208 or wafer stage 206, no liquid will be scattered due to the movement of the wafer stage 206. Processes like wafer alignment and wafer 208 unload/exchange can be performed at this time. After the new wafer has been aligned using one or more alignment tools 220, the wafer table 204 is repositioned under the optical assembly 16. Preferably, the wafer table 204 is positioned under the movable insertion member 226. The control system 230 then directs the motor 228 to retract the movable insertion member 226 from the space, preventing the escape of the immersion liquid 212 from adjacent the optical assembly 16, and to move the movable insertion member 226 to the position outside the space as shown in FIG. 3A. As a result, the space between the new wafer and the optical assembly 16 is filled with the immersion liquid 212. Exposure is then performed. In this manner, the insertion member positioning system 224 maintains the immersion liquid 212 adjacent to the lower most element of the optical assembly 16 during wafer exchange and during long fast moves of the substrate away from the optical assembly.

In various embodiments, the control system 230 may be a separate control system or it can be integrated into the control system used to control the exposure apparatus. Vertical position and/or tilt of at least one of the wafer table 204 and the movable insertion member 226 may be adjusted as needed before, during or after the wafer table 204 is moved out from under the optical assembly 16. The operation that is performed when the wafer table 204 is away from the optical assembly 16 is not limited to a wafer exchange operation. For example, an alignment operation, a measurement operation or other operations that involve long fast moves of the substrate or the wafer table may be executed while maintaining the immersion liquid 212 in the space between the movable insertion member 226 and the optical assembly 16.

Figure 4A:
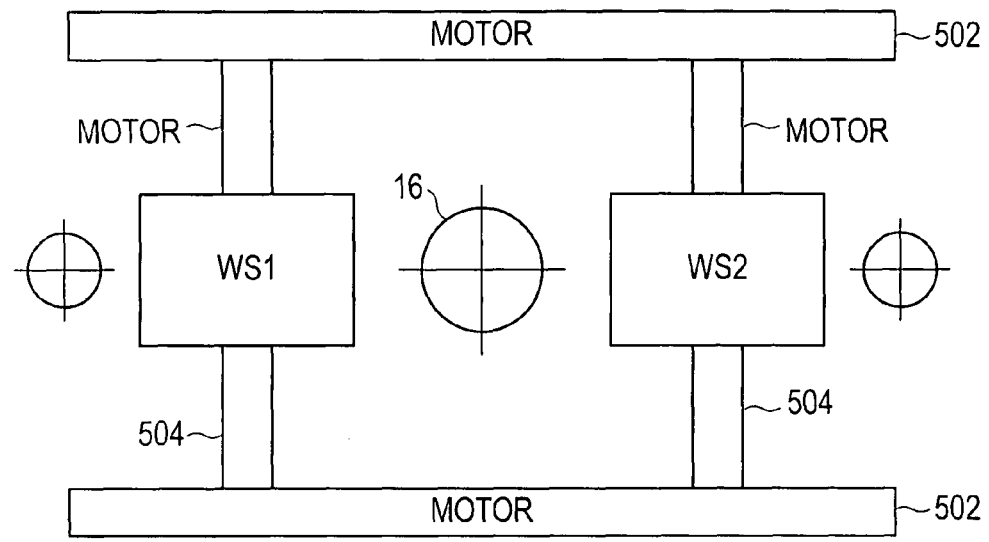
FIGS. 4A and 4B are plan views of two different twin wafer stages according to other embodiments.
Figure 4B:
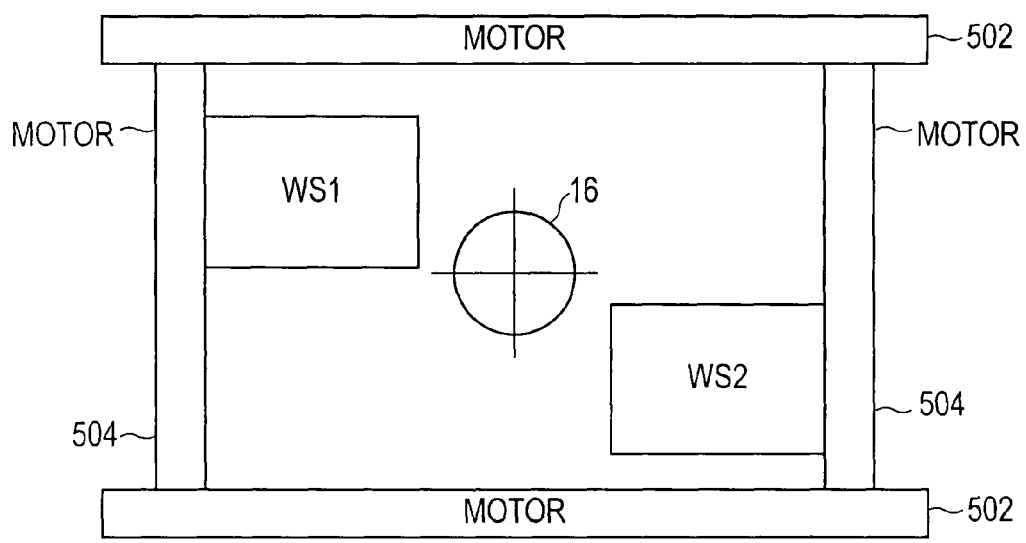

FIGS. 4A and 4B are plan views of two different twin stage immersion lithography systems according to other embodiments. For the basic structure and operation of the twin stage lithography systems, see U.S. Pat. Nos. 6,262,796 and 6,341,007. The disclosures of U.S. Pat. Nos. 6,262,796 and 6,341,007 are incorporated herein by reference in their entireties. In both embodiments, a pair of wafer stages WS1 and WS2 are shown. Motors 502 are used to move or position the two stages WS1 and WS2 in the horizontal direction (in the drawings), whereas motors 504 are used to move or position the stages WS1 and WS2 in the vertical direction (in the drawings). The motors 502 and 504 are used to alternatively position one stage under the optical assembly 16 while a wafer exchange and alignment is performed on the other stage. When the exposure of the wafer under the optical assembly 16 is complete, then the two stages are swapped and the above process is repeated. With either configuration, the various embodiments for maintaining immersion liquid in the space under the optical assembly 16 as described and illustrated above with regard to FIGS. 2A through 3B, can be used with either twin stage arrangement. With regard to the embodiment of FIGS. 2A and 2B for example, a single movable insertion member 226, motor 228, and control system 230 could be used adjacent to the optical assembly 16. The movable insertion member 226 is movable separately from the stages WS1 and WS2. When stages WS1 and WS2 are to be swapped, the movable insertion member 226 is moved into the space between the optical assembly 16 and the wafer 208 to maintain the immersion liquid 212 below the optical assembly 16. During a transition from a first state in which one of the stages WS1 and WS2 is positioned under the optical assembly 16 to a second state in which the other of the stages WS1 and WS2 is positioned under the optical assembly 16, the movable insertion member 226 is positioned under the optical assembly 16 and the space between the optical assembly 16 and the movable insertion member 226 is filled with the immersion liquid 212.

In the various embodiments described above, the movable insertion member can be made of a number of different materials, such as ceramic, metal and plastic. Because the movable insertion member is relatively thin and should not be deformed under a load or during an operation, it is preferable that the materials have a high stiffness that is resistant to deformation. The moveable insertion member may have a thickness of 50 microns to 5 mm. Preferably, the thickness ranges from 50 microns to 200 microns. These materials also may be coated with Teflon according to other embodiments. The size of the movable insertion member also should be sufficient to cover the area occupied by the immersion liquid. In the various embodiments described above, the surface of the last optical element of the optical assembly 16 is constantly under immersion fluid environment, preventing the formation of a fluid mark (e.g. "a water mark"). In addition, the insertion member is moved, for example, by a robot arm or other actuator.

Figure 5A:
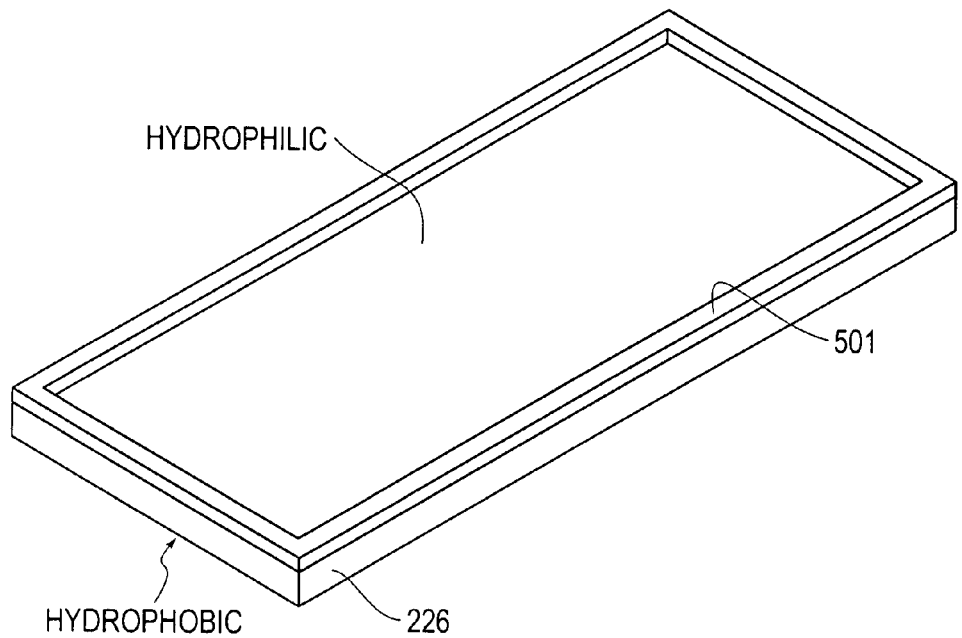
FIGS. 5A and 5B illustrate a further embodiment of the movable insertion member.
Figure 5B:
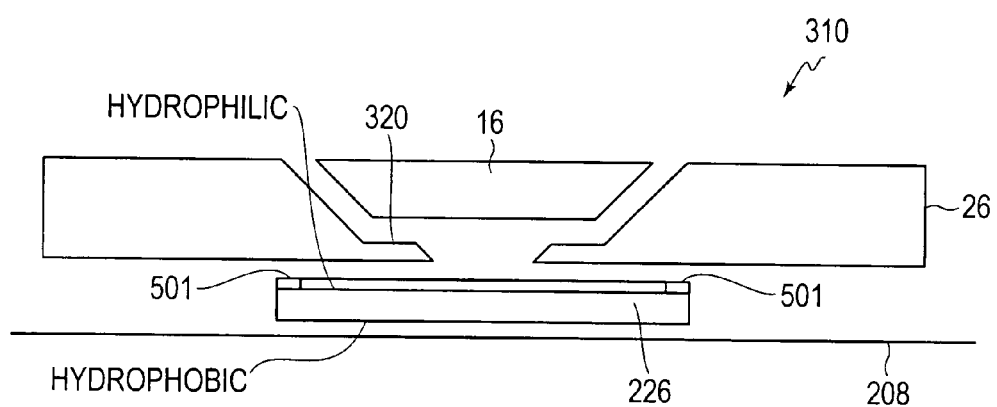

In some embodiments, the top surface (facing the optical assembly 16) and the bottom surface (facing the wafer 208) of the movable insertion member 226 neither repel nor attract liquid. In other embodiments, the top surface of the movable insertion member 226 attracts liquid (e.g., is hydrophilic) and the bottom surface of the movable insertion member 226 repels liquid (e.g., is hydrophobic). In a further embodiment, shown in FIGS. 5A and 5B, the bottom surface of the movable insertion member 226 is hydrophobic, and a hydrophobic bead 501 (not shown to scale) is provided around the perimeter of the top surface of the movable insertion member 226. The top surface of the movable insertion member 226 inside the hydrophobic bead 501 is hydrophilic.

Figure 6A:
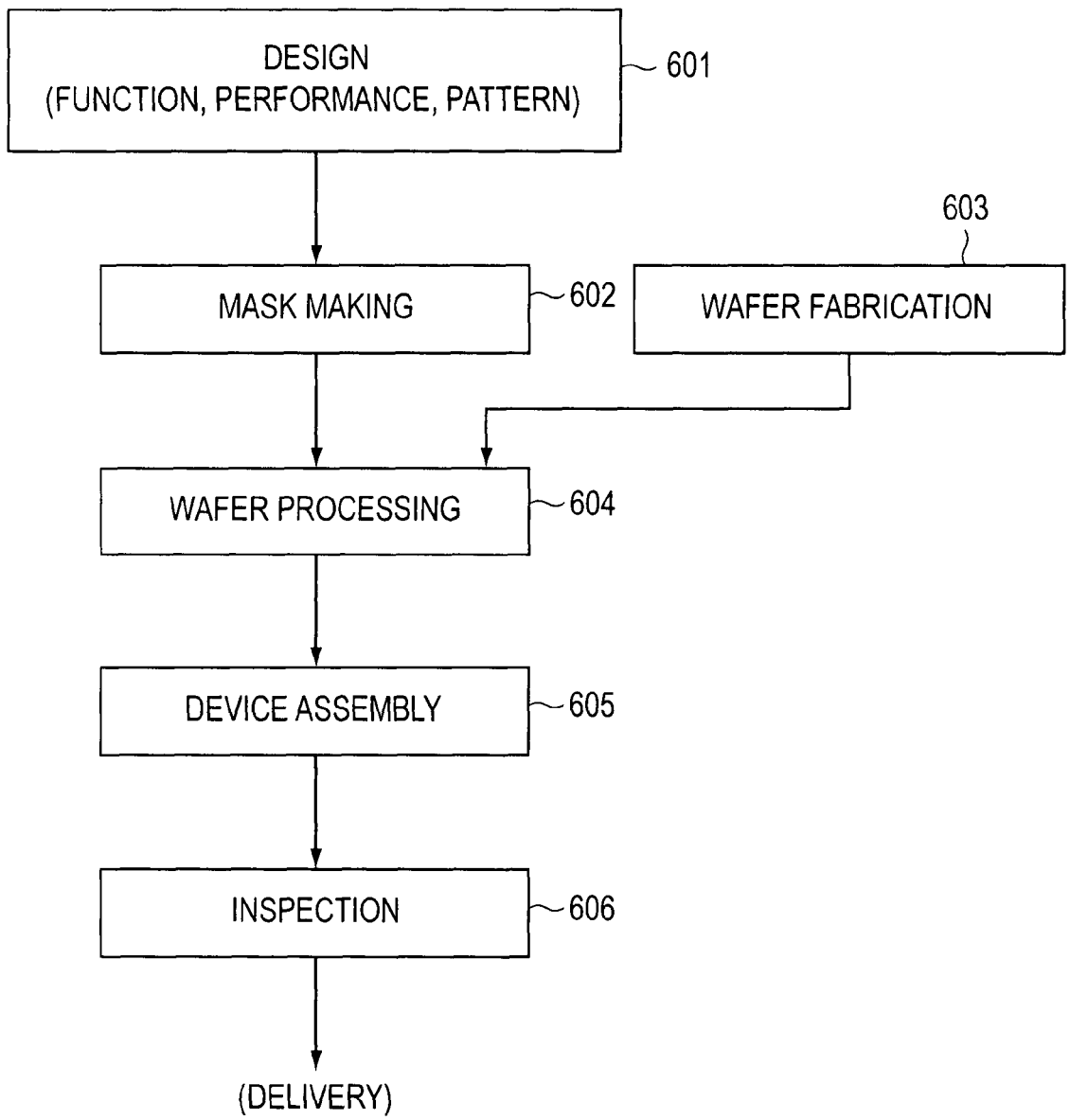
FIG. 6A is a flow chart that outlines a process for manufacturing a substrate.

Semiconductor wafers can be fabricated using the above described systems, by the process shown generally in FIG. 6A. In step 601 the substrate's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove. In step 605 the semiconductor substrate is assembled (including the dicing process, bonding process and packaging process). Finally, the substrate is then inspected in step 606.

Figure 6B:
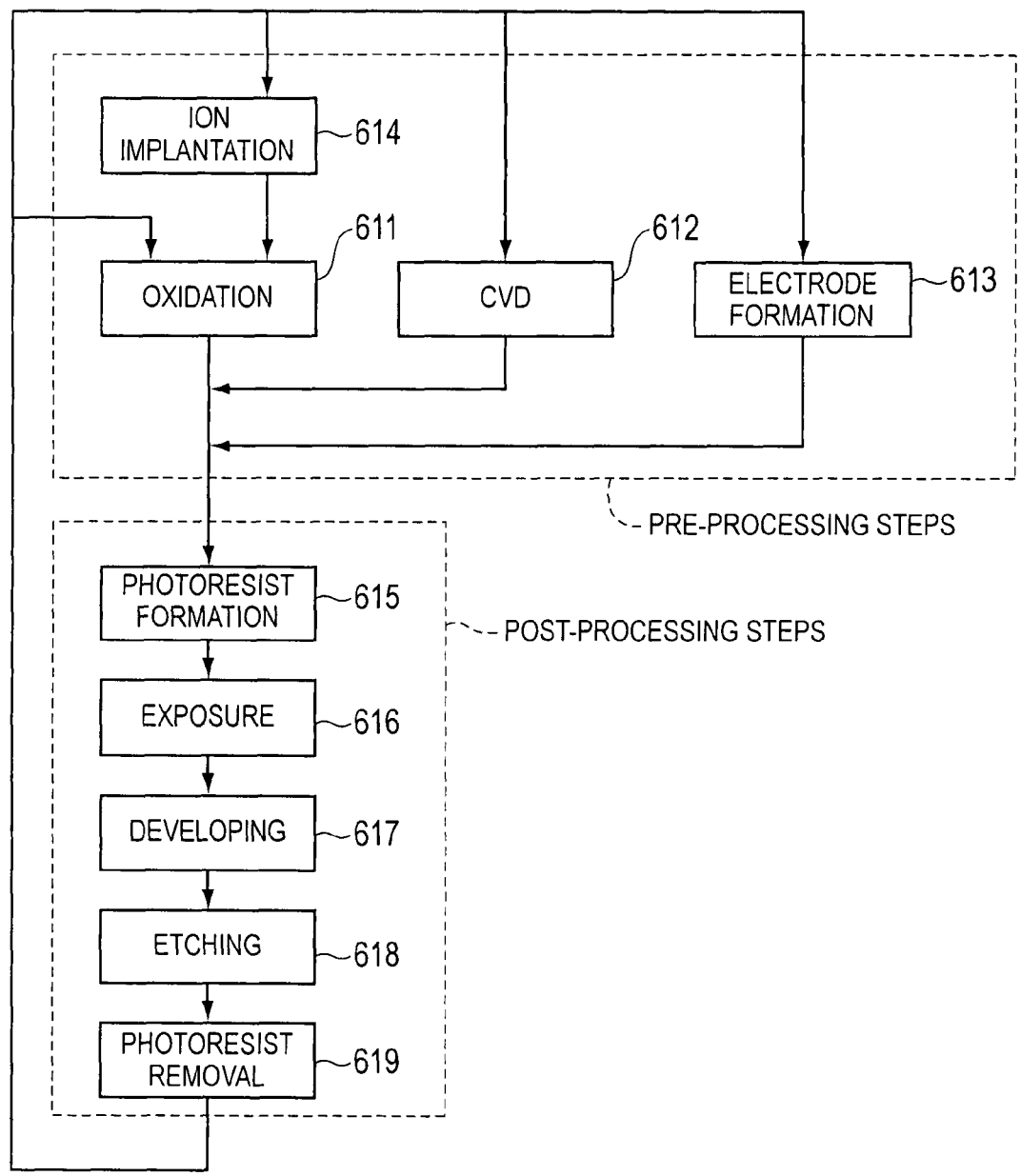
FIG. 6B is a flow chart that outlines substrate processing in more detail.

FIG. 6B illustrates a detailed flowchart example of the above-mentioned step 504 in the case of fabricating semiconductor substrates. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611-614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure substrate is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

While the particular lithography machines as shown and disclosed herein are fully capable of obtaining the objects and providing the advantages herein before stated, it is to be understood that they are merely illustrative embodiments of the invention, and that the invention is not limited to these embodiments.

What is claimed is:

1. A lithographic projection apparatus comprising:
   an optical assembly that projects an image onto a substrate;
   a stage assembly including a substrate table that supports the substrate adjacent to the optical assembly, a space between a final optical element of the optical assembly and the substrate being filled with an immersion liquid;
   a confinement member that forms at least a part of a boundary of the space and that confines the immersion liquid in the space, the confinement member spaced from the substrate table and encircling the final optical element of the optical assembly; and
   an insertion member removably insertable into the space between the confinement member and the substrate, the substrate table, or both, to divide the immersion liquid in the space into a first portion and a second portion, the first portion disposed between the final optical element and the insertion member with the confinement member and the insertion member confining the first portion of the immersion liquid, the second portion disposed between the insertion member and the substrate, the substrate table, or both, the insertion member keeping the final optical element in contact with the first portion of the immersion liquid when the substrate is moved away from being disposed adjacent to the optical assembly,
   wherein the immersion liquid in the second portion is removed via the confinement member while the insertion member is positioned between the confinement member and the substrate, the substrate table, or both.

2. The apparatus of claim 1, further comprising a control system that moves the insertion member into and out of the space between the optical assembly and the substrate, the substrate table, or both.

3. The apparatus of claim 1, wherein the immersion liquid confined by the confinement member covers a localized area of a surface of the substrate during exposure of the substrate.

4. The apparatus of claim 1, further comprising a substrate exchange system that replaces a substrate on the substrate table with a second substrate.

5. The apparatus of claim 1, further comprising:
   a second stage assembly including a second substrate table that supports a second substrate; and
   a control system that controls movement of the first stage assembly and of the second stage assembly so that the two stage assemblies are alternately positioned adjacent to the optical assembly.

6. The apparatus of claim 5, wherein during a transition from a first state in which one of the substrate tables is positioned under the optical assembly to a second state in which the other of the substrate tables is positioned under the optical assembly, the immersion liquid is maintained under the optical assembly using the insertion member.

7. The apparatus of claim 1, wherein a surface of the insertion member that faces toward the final optical element is hydrophilic.

8. The apparatus of claim 1, further comprising:
   an actuator that physically holds the insertion member and that moves the insertion member into and out of the space between the confinement member and the substrate, the substrate table, or both, the actuator physically holding the insertion member in the space while keeping the insertion member spaced away from the confinement member so that the insertion member does not contact the confinement member while the insertion member is keeping the final optical element in contact with the first portion of the immersion liquid.

9. The apparatus of claim 1, wherein a bottom surface of the insertion member includes a fluoric material.

10. The apparatus of claim 1, wherein a bottom surface of the insertion member is hydrophobic with regard to the immersion liquid.

11. The apparatus of claim 1, wherein the substrate is moved at a first speed when the immersion liquid is on the substrate, and is moved at a second speed which is faster than the first speed after the immersion liquid in the second portion has been removed.

12. A device manufacturing method comprising:
- providing an immersion liquid to a space between a final optical element of a projection system and a substrate supported on a substrate table;
- confining the immersion liquid in the space with a confinement member that forms at least a part of a boundary of the space, the confinement member spaced from the substrate table and encircling the final optical element of the projection system;
- moving an insertion member into the space between the confinement member and the substrate, the substrate table, or both, to divide the immersion liquid into a first portion disposed between the final optical element and the insertion member with the confinement member and the insertion member confining the first portion of the immersion liquid and a second portion disposed between the insertion member and the substrate, the substrate table, or both; and
- maintaining the final optical element of the projection system in contact with the first portion of the immersion liquid while moving the substrate away from being disposed adjacent to the projection system,
- wherein the immersion liquid in the second portion is removed via the confinement member while the insertion member is positioned between the confinement member and the substrate, the substrate table, or both.

13. The method of claim 12, further comprising:
- replacing the substrate with a second substrate after the second portion of the immersion liquid is removed.

14. The method of claim 12, wherein the substrate is one of a semiconductor wafer and a glass panel.

15. The method of claim 12, wherein the final optical element of the projection system maintains contact with the first portion of the immersion liquid during a substrate exchange and during moves of the substrate, the substrate table, or both, away from the projection system.

16. The method of claim 12, wherein a surface of the insertion member that faces toward the final optical element is hydrophilic.

17. The method of claim 12, wherein an actuator physically holds the insertion member and moves the insertion member into and out of the space between the confinement member and the substrate, the substrate table, or both, the actuator physically holding the insertion member in the space while keeping the insertion member spaced away from the confinement member so that the insertion member does not contact the confinement member while the insertion member is keeping the final optical element in contact with the first portion of the immersion liquid.

18. The method of claim 12, wherein a bottom surface of the insertion member includes a fluoric material.

19. The method of claim 12, wherein a bottom surface of the insertion member is hydrophobic with regard to the immersion liquid.

20. The method of claim 12, wherein the substrate is moved at a first speed when the immersion liquid is on the substrate, and is moved at a second speed which is faster than the first speed after the immersion liquid in the second portion has been removed.

21. A lithographic projection apparatus comprising:
- an optical assembly that projects an image onto a substrate;
- a stage assembly including a substrate table that supports the substrate adjacent to the optical assembly, a space between a final optical element of the optical assembly and the substrate being filled with an immersion liquid during exposure of the substrate;
- a confinement member that forms at least a part of a boundary of the space and that confines the immersion liquid in the space, the confinement member spaced from the substrate table and encircling the final optical element of the optical assembly;
- an insertion member removably insertable into the space between the confinement member and the substrate, the substrate table, or both, to divide the immersion liquid in the space into a first portion and a second portion, the first portion disposed between the final optical element and the insertion member with the confinement member and the insertion member confining the first portion of the immersion liquid, the second portion disposed between the insertion member and the substrate, the substrate table, or both, the insertion member keeping the final optical element in contact with the first portion of the immersion liquid when the substrate is moved away from being disposed adjacent to the optical assembly; and
- a device releasably coupled to the insertion member, the device (i) inserts the insertion member into the space between the confinement member and the substrate, the substrate table, or both, so that the insertion member and the confinement member can maintain the first portion of the immersion liquid in contact with the optical assembly, and (ii) removes the insertion member out of the space.

22. The apparatus of claim 21, wherein the device is an actuator that physically holds the insertion member and that moves the insertion member into and out of the space between the confinement member and the substrate, the substrate table, or both, the actuator physically holding the insertion member in the space while keeping the insertion member spaced away from the confinement member so that the insertion member does not contact the confinement member while the insertion member is keeping the final optical element in contact with the first portion of the immersion liquid, the actuator being releasably coupled to the insertion member.

23. A lithographic projection apparatus comprising:
- an optical assembly that projects an image onto a substrate;
- a stage assembly including a substrate table that supports the substrate adjacent to the optical assembly, a space between a final optical element of the optical assembly and the substrate being filled with an immersion liquid;
- a confinement member that forms at least a part of a boundary of the space and that confines the immersion liquid in the space, the confinement member spaced from the substrate table and encircling the final optical element of the optical assembly; and
- an insertion member removably insertable into the space between the confinement member and the substrate, the substrate table, or both, to divide the immersion liquid in the space into a first portion and a second portion, the first portion disposed between the final optical element and the insertion member with the confinement member and the insertion member confining the first portion of the immersion liquid, the second portion disposed between the insertion member and the substrate, the substrate table, or both, the insertion member keeping the final optical element in contact with the first portion of the immersion liquid when the substrate, the substrate table, or both, is moved away from being disposed adjacent to the optical assembly during a substrate exchange and during moves of the substrate, the substrate table, or both, away from the optical assembly, wherein the immersion liquid in the second portion is removed via the confinement member while the insertion member is positioned between the confinement member and the substrate, the substrate table, or both.

24. The apparatus of claim 23, wherein a surface of the insertion member that faces toward the final optical element is hydrophilic.

25. The apparatus of claim 23, further comprising:
an actuator that physically holds the insertion member and that moves the insertion member into and out of the space between the confinement member and the substrate, the substrate table, or both, the actuator physically holding the insertion member in the space while keeping the insertion member spaced away from the confinement member so that the insertion member does not contact the confinement member while the insertion member is keeping the final optical element in contact with the first portion of the immersion liquid.

26. The apparatus of claim 23, wherein a bottom surface of the insertion member includes a fluoric material.

27. The apparatus of claim 23, wherein a bottom surface of the insertion member is hydrophobic with regard to the immersion liquid.

28. The apparatus of claim 23, wherein the substrate is moved at a first speed when the immersion liquid is on the substrate, and is moved at a second speed which is faster than the first speed after the immersion liquid in the second portion has been removed.

29. A method used in a lithographic projection apparatus, the method comprising:
providing an immersion liquid to a space between a final optical element of a projection system and a substrate supported on a substrate table;
confining the immersion liquid in the space with a confinement member that forms at least a part of a boundary of the space, the confinement member spaced from the substrate table and encircling the final optical element of the projection system;
moving an insertion member into the space between the confinement member and the substrate, the substrate table, or both, to divide the immersion liquid into a first portion disposed between the final optical element and the insertion member with the confinement member and a second portion disposed between the insertion member and the substrate, the substrate table, or both; and
maintaining the final optical element of the projection system in contact with the first portion of the immersion liquid while moving the substrate away from being disposed under the final optical element of the projection system, wherein
the insertion member is inserted such that a top surface faces the final optical element, and the top surface of the insertion member has a hydrophilic portion.

30. The method of claim 29, further comprising:
removing the second portion of the immersion liquid from between the insertion member and the substrate, the substrate table, or both.

31. The method of claim 30, wherein the substrate is moved away from under the final optical element, after the second portion of the immersion liquid is removed.

32. The method of claim 29, wherein the insertion member has a thickness of 50 microns to 5 mm.

33. The method of claim 29, wherein the insertion member has a thickness of 50 microns to 200 microns.

34. The method of claim 29, wherein the insertion member is inserted such that a back surface of the insertion member faces the substrate, the substrate table, or both, and the back surface of the insertion member has a hydrophobic portion.

* * * * *